United States Patent [19]

Ebihara

[11] Patent Number: 4,589,097

[45] Date of Patent: May 13, 1986

[54] NON-VOLATILE MEMORY CIRCUIT HAVING A COMMON WRITE AND ERASE TERMINAL

[75] Inventor: Heihachiro Ebihara, Tanashi, Japan

[73] Assignee: Citizen Watch Company Limited, Tokyo, Japan

[21] Appl. No.: 475,424

[22] Filed: Mar. 15, 1983

[30] Foreign Application Priority Data

Mar. 16, 1982 [JP] Japan .................................. 57-41183
Apr. 27, 1982 [JP] Japan .................................. 57-69642

[51] Int. Cl.$^4$ ........................ G11C 7/00; G11C 11/36
[52] U.S. Cl. ..................................... 365/185; 365/189
[58] Field of Search ............... 365/185, 184, 218, 189; 357/23.5

[56] References Cited

U.S. PATENT DOCUMENTS

4,247,918 1/1981 Iwahashi et al. .................... 357/23.5
4,305,083 12/1981 Gutierrez ............................ 365/185
4,366,555 12/1982 Hu ....................................... 365/185

OTHER PUBLICATIONS

Gosney, "DIFMOS-A Floating Gate Electrically Erasable Nonvolatile Semiconductor Memory Technology," IEEE Transactions on Electron Devices, vol. ED-24, No. 5, May 1977, pp. 594-599.
Koike et al, "Electrically Erasable Nonvolatile Optical MNOS Memory Device," IEEE Journal of Solid State Circuits, vol. SC-11, No. 2, Apr. 1976, pp. 303-307.

Primary Examiner—Stuart N. Hecker
Assistant Examiner—Glenn A. Gossage
Attorney, Agent, or Firm—Jordan and Hamburg

[57] ABSTRACT

A non-volatile memory circuit comprising a plurality of semiconductor non-volatile memory elements, with erasure of data stored in all of these elements, enabling of selective write-in to all of the elements and read-out of stored data being controlled by potentials applied to a single control terminal. Use of a single terminal for these functions, rather than a pair of terminals as in the prior art, makes the circuit highly suitable for ultraminiature electronic device applications.

4 Claims, 7 Drawing Figures

NON-VOLATILE MEMORY CIRCUIT HAVING A COMMON WRITE AND ERASE TERMINAL

BACKGROUND OF THE INVENTION

The present invention relates to in general to non-volatile memory circuits, and in particular to an improved non-volatile memory circuit which employs semiconductor (i.e. MOS insulated gate) non-volatile memory elements.

In recent years, a new type of non-volatile memory element has been developed, i.e. a memory element which can store digital data even if the power source driving circuitry controlling that element is removed. This new type of non-volatile memory element is of semiconductor type, having a gate electrode to which control voltages are applied, and also source, drain and substrate electrodes, as in the case of a metal oxide semiconductor (MOS) field effect transistor, and can be formed within an integrated circuit chip together with MOS transistors and other circuit elements. With such a non-volatile memory element, applying a voltage of specific polarity and of sufficient magnitude to the gate electrode of the element will result in the threshold voltage of the element being set to a fixed value. The threshold voltage will remain at that value for a substantial period of time after removal of the high voltage from the gate electrode, even if the power source voltage of the circuit containing the non-volatile memory element is removed. If however a sufficiently high voltage of opposite polarity to that referred to above is thereafter applied to the gate electrode of the non-volatile memory element, then the threshold voltage of the element will change to become fixed at a different value, and again will remain at that value for a substantial period of time. Thus, two different states, corresponding to a single binary bit of data, can be stored by each non-volatile memory element. Data can be read out by applying a voltage of suitable value to the gate electrode of the non-volatile memory element, whereby the current state of the non-volatile memory element will be indicated by an ouput voltage appearing at the drain electrode thereof.

Such non-volatile memory elements are extremely suitable for providing a large amount of non-volatile memory capacity within an extremely small area of an integrated circuit chip, since only a very few circuit elements need be coupled to each non-volatile memory element. However with prior art circuit arrangements incorporating such elements, it has been necessary to provide a pair of terminals or connecting leads coupling the memory circuit to other circuits, with one of these terminals serving to apply a high voltage of one polarity to the gate electrodes of a plurality of non-volatile memory elements, e.g. for enabling write-in of data to the non-volatile memory elements, and the other serving to apply a high voltage of opposite polarity to the circuit, e.g. for erasing the stored contents of the non-volatile memory elements.

In order to make a non-volatile memory circuit employing such non-volatile memory elements more suitable for ultra-miniature circuit applications, it is desirable to reduce the number of externally connected terminals or connecting leads as far as possible, and this is achieved by the present invention whereby only a single input terminal need be provided to control write-in, readout and erasure of data, for a plurality of non-volatile memory elements.

SUMMARY OF THE DISCLOSURE

A non-volatile memory circuit according to the present invention comprises a plurality of non-volatile memory elements, each having the source electrode thereof connected to a first power source potential and having the drain electrode connected through a resistor (or a resistance element formed within an integrated circuit containing the non-volatile memory elements) to a second power source potential. Each non-volatile memory element is coupled to a corresponding control transistor, with the source electrode of each control transistor being coupled through a diode to one of the power source potentials and the drain electrode of each control transistor being coupled to the gate electrode of the corresponding non-volatile memory element. In addition the drain electrode of each control transistor is coupled through a corresponding resistor to a common control terminal. Data input signals are applied to the gate electrodes of the control transistors. The diodes are connected such that, when a high voltage (e.g. of the order of 30 V) of a first polarity is applied to the common control terminal, then all of the diodes are set in the reverse-biased state, so that irrespective of the state of the data signal inputs to the gate electrodes of the control transistors, the gate electrodes of all of the non-volatile memory elements are set to a high voltage of the first polarity. As a result, all of the non-volatile memory elements have their threshold voltage set to a first value, irrespective of their previous states, so that this is an erased state of the non-volatile memory circuit. When a high voltage of the opposite polarity is then applied to the common control terminal, then since all of the diodes will be forward biased with respect to that voltage, the gate electrode of any non-volatile memory element whose control transistor has a data input such as to set that control transistor in the conductive (i.e. ON) state will be set at a potential close to the supply voltage potential coupled to the corresponding diode. As a result, no change will occur in the threshold voltage of such a non-volatile memory element. Conversely, the gate electrode of any non-volatile memory element whose control transistor has a data input such as to set that control transistor in the non-conductive (i.e. OFF) state will be set at said opposite polarity high potential, and as a result each of such non-volatile memory elements will change to a different value of threshold voltage.

Thereafter, by applying a voltage of suitable magnitude to the common control terminal (i.e. a voltage of smaller magnitude than will result in a change in threshold voltage) it is possible to read out the stored contents of the non-volatile memory circuit, by sensing the resulting changes in the voltage appearing at the drain electrode of each non-volatile memory element.

In this way it is possible to erase the stored contents of all of the non-volatile memory elements of such a memory circuit and then to selectively write in binary data to the non-volatile memory elements, and to thereafter read out the stored data, with all of these functions being performed by utilizing a single control terminal coupling the non-volatile memory circuit to external circuit means.

The above description will be made clearer in the following explanation of the preferred embodiments.

DESCRIPTION OF THE PREFERRED EMBODIMENTS

Figure 1:
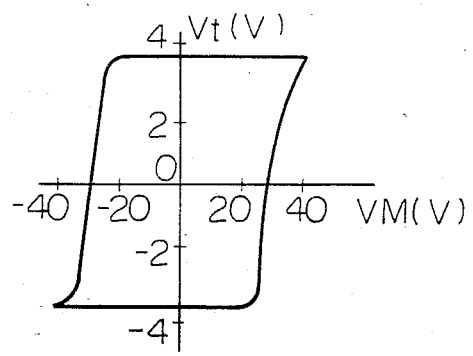
FIG. 1 is a diagram showing the relationship between changes in the threshold voltage of a semiconductor non-volatile memory element and largeamplitude voltages applied to a gate electrode thereof.

The present invention will now be described, referring to the drawings. FIG. 1 is a diagram showing the write-in and erase characteristics of a P-channel non-volatile memory element, with the threshold voltage being shown along the vertical axis and the voltage applied to the gate electrode of the memory element being shown along the horizontal axis. When a sufficiently high positive potential (typically of the order of +30 V) is applied to the gate electrode of the non-volatile memory element, the threshold voltage (hereinafter abbreviated to Vth) of the non-volatile memory element moves to take a low value (e.g. of the order of −3.5 V as shown in the example of FIG. 1) in a direction which will be referred to as the depletion direction. Conversely, when a large negative potential (e.g. of the order of −30 V) is applied to the gate electrode of the non-volatile memory element, the threshold voltage moves in the opposite direction, referred to as the enhancement direction (e.g. to take a value of the order of +3.5 V, as shown in FIG. 1). After the value of Vth has been set in this way, that value will remain fixed, i.e. memorized, for a substantial period of time (whose duration will depend upon the design of the particular memory element), even if the power supply to the circuit is removed, i.e. non-volatile storage is attained.

Subsequently, by applying a suitable level of readout voltage Vr to a circuit which contains the non-volatile memory element, it is possible to determine whether Vth is high or low. In this way, the non-volatile memory element can be set into two different states, i.e. such an element can store and read out the 1 and 0 logic levels.

Two methods can be envisaged for memorizing data using such a non-volatile memory element (referred to in the following simply as a memory element). One method is to perform selective write-in of data, and the other is to perform selective erasure of data. In the following it will be assumed that write-in of data corresponds to movement of Vth in the depletion direction, while erasure corresponds to movement of Vth in the enhancement direction, and that the selective write-in method is used. In this case, simultaneous erasure of all of a plurality of non-volatile memory elements is performed unconditionally, and thereafter selective write-in is performed to only those non-volatile memory elements for which it is necessary.

Figure 2:
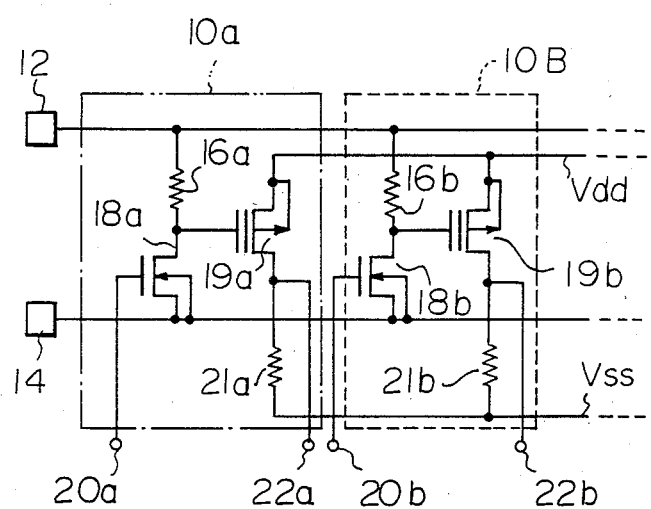
FIG. 2 is a circuit diagram of a prior art type of non-volatile memory circuit utilizing semiconductor non-volatile memory elements.

FIG. 2 is a circuit diagram of a prior art type of non-volatile memory circuit which utilizes memory elements of the type described above. This is provided with a write-in voltage input terminal 12, and an erase voltage input terminal 14, coupled to a plurality of memory cells 10a, 10b, each of which can store a single data bit. The write-in voltage input terminal 12 is coupled through resistors 16a, 16b, . . . , to the gate electrodes of a plurality of non-volatile memory elements 19a, ·b, . . . , respectively. The circuit further comprises a plurality of transistors 18a, 18b, . . . , each having a gate electrode which is coupled to a corresponding one of a set of data input lines 20a, 20b, . . . , with each of transistors 18a, 18b, . . . , being controlled by data which appears on a corresponding one of the data input lines 20a, 20b, . . .

The drain electrodes of transistors 18a, 18b, . . . , are coupled to the gate electrodes of non-volatile memory elements 19a, 19b, . . . , respectively. The source and substrate electrodes of transistors 18a, 18b, . . . , are coupled in common to the erase voltage input terminal 14. The source and substrate electrodes of non-volatile memory elements 19a, 19b, . . . , are coupled to the positive power source potential Vdd, while the drain electrodes of these memory elements are respectively connected through resistors 21a, 21b, . . . , to the negative power source potential Vss. These power source potentials can typically be 0 V and −1.5 V, respectively. Thus, the data input lines are coupled to the gate electrodes of transistors 18a, 18b, . . . , while the output lines 22a, 22b, . . . , are coupled to the drain electrodes of non-volatile memory elements 19a, 19b, . . . .

The write-in and erase means employed in the circuit configuration of FIG. 2 will now be described. In case of erasure, a voltage which is substantially negative with respect to potential Vdd is applied to erase voltage input terminal 14. The write-in voltage input terminal 12 can be left in the open-circuit state, or can be held at a potential which is lower than Vdd. If it is assumed that signals at the Vdd level are applied to all of the data input lines 20a, 20b, . . . , in this condition, then all of transistors 18a, 18b, . . . , will be set in the ON state, and as a result, all of the gate electrodes of non-volatile memory elements 19a, 19b, . . . , will have a substantially high value of negative voltage applied thereto. All of the non-volatile memory elements 19a, 19b, . . . , will therefore be set in the enhancement state.

Selective write-in will now be described. In this case, the erase voltage input terminal 14 is held at the Vss level. Signals at the Vdd or at the Vss level, as required, are applied arbitrarily to the data input lines 20a, 20b, . . . , and a high level of positive voltage is applied to the write-in voltage input terminal 12. For example, if it is assumed that data input line 20a of transistor 18a is at the Vss potential, then transistor 18a will enter the OFF state, and as a result the gate electiode of non-volatile memory element 19a will be coupled to a high value of positive voltage through resistor 16a. Thus, memory element 19a will be set in the depletion state.

On the other hand, if it is assumed that data line 20b of transistor 18b is set to the Vdd potential, then transistor 18b will be set in the ON state, and as a result current will flow in resistor 16b which will cause a potential drop at the gate electrode of non-volatile memory element 19b. Thus, a voltage which is approximately equal to Vss will become applied to the gate electrode of memory element 19b, so that this element continues in the enhancement state.

The operation of a prior art type of non-volatile memory circuit has been described in the above. As will be clear from this description, it is necessary to utilize external terminals 12 and 14 to perform write-in and erase operations with such a non-volatile memory circuit. When such a circuit is utilized in a very small-size electronic device such as a timepiece, it is desirable to reduce the number of external terminals of the non-volatile memory circuit to the minimum possible number. The circuit substrate of an electronic timepiece is extremely small, and the number of terminals provided thereon has a considerable effect upon the overall size of the timepiece.

Figure 3:
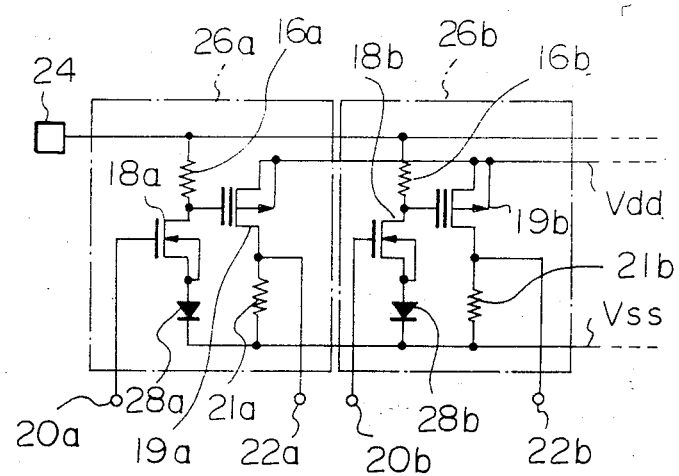
FIG. 3 is a circuit diagram of a first embodiment of a non-volatile memory circuit according to the present invention.

A non-volatile memory circuit according to the present invention will now be described, in which a single terminal is used in common to replace terminals 12 and 14. FIG. 3 shows a first embodiment of a non-volatile memory circuit according to the present invention, comprising a plurality of memory cells 26a, 26b, ..., each containing a non-voltatile memory element 19a, 19b, ..., and provided with a single control terminal 24 for coupling the memory circuit to external circuits, for receiving data write-in, erase and read-out signals, i.e. which is utilized in common for application of the write-in and erase voltages described above with reference to the prior art example, and so performs the functions of both of terminals 12 and 14 in the prior art embodiment of FIG. 2. The source and substrate electrodes of the non-volatile memory elements 19a, 19b, ..., are connected to the Vdd potential. The drain electrodes of non-volatile memory elements 19a, 19b, ..., are connected through resistors 21a, 21b, ..., respectively to the Vss potential, while the gate electrodes are respectively coupled through resistors 16a, 16b, ..., to the write-in and erase voltage input terminal 24 and are also coupled to the drain electrodes of transistors 18a, 18b, ..., respectively. The source and substrate electrodes of transistors 18a, 18b, ..., are connected through diodes 28a, 28b, ..., respectively to the Vss potential, while the gate electrodes of transistors 18a, 18b, ..., are coupled to the data input lines 20a, 20b, ..., respectively. With this circuit, write-in and erase operations are performed in the following way.

Firstly, if write-in and erase voltage input terminal 24 is set to a substantially negative potential, (typically of the order of −30 V as described above) then irrespective of the conditions of transistors 18a, 18b, ..., the diodes 28a, 28b, ..., will all be reverse-biased, thereby preventing current flow through resistors 16a, 16b, .... Thus, the gate electrodes of non-volatile memory elements 19a, 19b, ..., will be coupled to a substantially large value of negative potential, so that all of these elements will be set in the enhancement state.

If a high value of positive voltage (e.g. of the order of +30 V) is applied to write-in and erase voltage input terminal 24, and if the Vdd potential is applied to data input line 20a, then since transistor 18a is in the ON state, current will flow through transistor 18a and diode 28a. As a result, the high level of potential will not be applied to the gate electrode of memory element 19a, so that this element will be left in the enhancement state.

If on the other hand when the high positive potential is applied to write-in and erase voltage input terminal 24 the Vss potential is applied to data input line 20b, then transistor 18b will enter the OFF state, and as a result a high positive potential will be applied to the gate electrode of memory element 19b. This element will thereby change to the depletion state.

Figure 4:
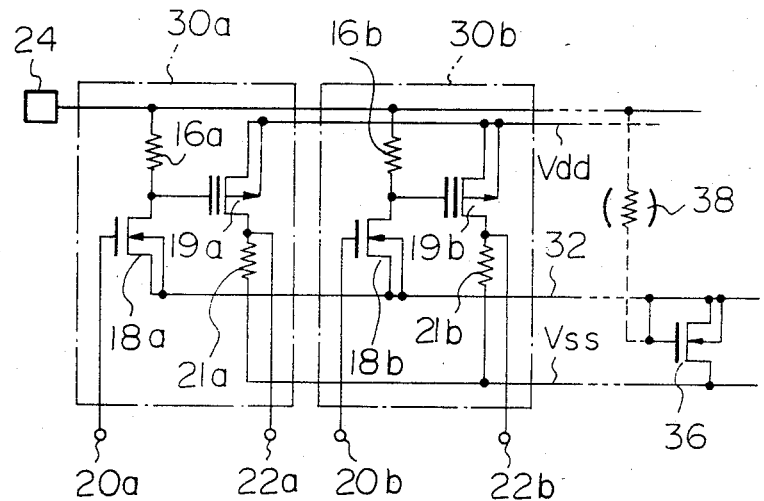
FIG. 4 is a circuit diagram of a second embodiment of a non-volatile memory circuit according to the present invention, in which a single diode element is utilized in common for a plurality of non-volatile memory elements.

In FIG. 3, diodes 28a, 28b, ..., are shown coupled between the common connection points of the source and substrate electrodes of transistors 18a, 18b, ..., repectively and the Vss potential. However it is equally possible in pratice to couple the source electrodes and substrates of a plurality of transistors 18a, 18b, ..., in common, and connect these through a single diode to the Vss potential. This is illustrated in the embodiment of FIG. 4, in which the diode is made up of an MOS transistor 36. The source electrodes and substrates of all of transistors 18a, 18b, ..., are connected to a common line, designated as 32, which is coupled to the gate electrode, drain electrode and substrate of MOS transistor 36, with the source electrode of transistor 36 being connected to the Vss potential. An alternative method of connection is illustrated by the broken lines in FIG. 4, whereby write-in and erase voltage input terminal 24 is coupled through a resistor 38 to the gate electrode of MOS transistor 36. It is also possible to connect terminal 24 directly to the gate electrode of transistor 36.

It is possible that a problem will arise with the embodiments of the present invention described above, as will now be described. After an erase or write-in operation has been performed, electrical noise may appear upon the write-in and erase voltage input terminal 24, as a result of static electricity or electrical induction. Such induced electrical interference is generally produced from a source having a relatively high impedance, so that its effects can be eliminated by incorporation of a certain amount of impedance between terminal 24 and ground potential, if this is sufficiently low. However the problem of interference due to static electricity will remain.

Figure 5A:
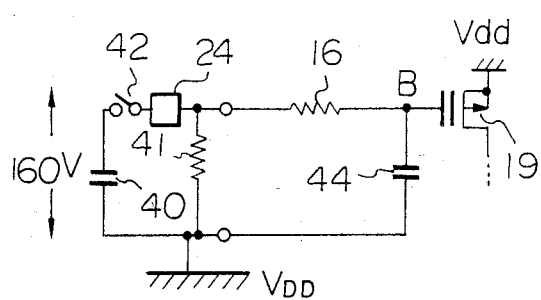
FIG. 5(a) is an equivalent circuit of a source of static electrical interference coupled to a non-volatile memory circuit.
Figure 5B:
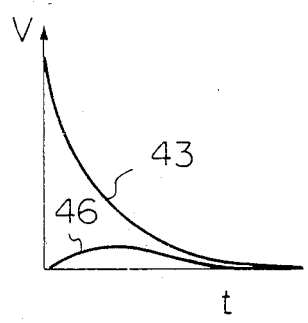
FIG. 5(b) is a graph showing the waveforms of noise produced by such interference.

Such static electricity interference is frequently generated by the human body, and can be simulated by the model shown in FIG. 5(a), which assumes that the static electricity interference source corresponds to a capacitor 40 having a capacitance value C1, of the order of 200 pf, which is charged to 160 V. When switch 42 of the simulation model of FIG. 5(a) is closed, with the model coupled to a non-volatile memory circuit according to the present invention having the configuration of the embodiments described above, then a voltage will appear on write-in and erase voltage input terminal 24 having the waveform shown in FIG. 5(b). If it is assumed that the impedance existing between terminal 42 and ground potential can be represented by a resistor 41 shown in FIG. 5(a), having a resistance value R1, then the time constant of the discharge of this voltage will be determined by value R1 and the capacitance value C1. The waveform of the voltage discharge thus produced appearing at terminal 24 is shown by curve 43 in FIG. 5(b). Since the maximum value of this voltage will be 160 V, it is possible that this will cause a change in the contents of memory element 19.

Figure 6:
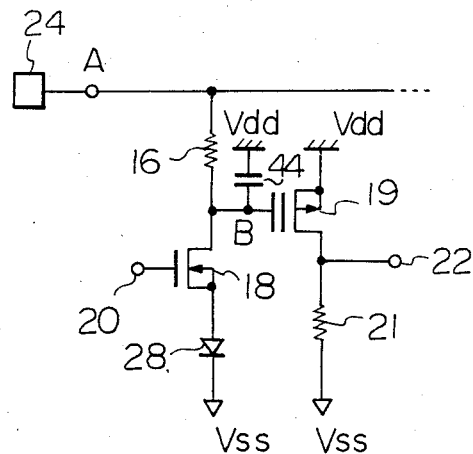
FIG. 6 is a circuit diagram of a third embodiment of the present invention, incorporating an integrator circuit to eliminate the effects of interference caused by static electricity.

An embodiment of the present invention will now be described, which overcomes the problem described above. FIG. 6 shows a circuit diagram of this embodiment, with only a single memory cell of the memory circuit being shown, for simplicity of description. As shown, the gate electrode of memory element 19 is coupled through a capacitor 44 to the high potential Vdd, which is assumed to be at ground potential.

If the value of resistance of resistor element 16 is designated as R0, and the value of capacitance of capacitor 44 coupled to the gate electrode of memory element 19 is designated as C0, then R0 and C0 form an integrator circuit which integrates the voltage applied to common external terminal 24. The waveform of the output voltage from this integrator circuit, i.e. the voltage which appears at junction point B coupled to the gate electrode of memory element 19, is illustrated by curve 46 in FIG. 5(b). The greater the amount by which R0.C0 is larger than R1.C1, the lower will be the peak voltage attained by junction point B. For example, if it is assumed that C1 is 200 pf, and R1 is 10 K ohms, and that C0 is 2 pf and R0 is 4K ohms, and that C1 is charged to 160 V when switch 42 is closed, then the maximum value of voltage that will appear at junction point B will be 14 V. As a result, there will be no change in the contents stored in memory element 19.

Thus, as described in the above, the present invention enables changes in the memory contents of a non-volatile memory element resulting from static electricity interference to be eliminated, whereby an extremely reliable non-volatile memory circuit can be produced. In addition, since only a single externally connected terminal need be provided to control write-in and erase operations of such a memory circuit, the circuit is highly suitable for ultra-miniature applications, for use in extremely small electronic devices such as electronic wristwatches, etc.

Although the present invention has been described in the above with reference to specific embodiments, it should be noted that various changes to these embodiments may be envisaged, which would fall within the scope claimed for the present invention, as set out in the appended claims.

What is claimed is:

1. A non-volatile memory circuit for storing data which is input thereto as a plurality of data signals in parallel form, each data signal varying between a first and a second low potential level, comprising:
    a plurality of semiconductor non-volatile memory elements each provided with a source electrode, a gate electrode and a drain electrode, with all of said source electrodes of said non-volatile memory elements being connected in common to said first low potential level;
    a common control terminal coupled to receive a first high potential level when said non-volatile memory circuit is operating in a write-in mode in which said data are stored therein and to receive a second high potential level of opposite polarity to said first high potential level when said non-volatile memory circuit is operating in an erase mode in which said stored data are erased;
    a plurality of first resistive elements each coupled between said common control terminal and a gate electrode of a corresponding one of said non-volatile memory elements;
    a plurality of control transistors each provided with a drain electrode which is connected to a corresponding one of said gate electrodes of said non-volatile memory elements, a gate electrode which is coupled to receive a corresponding one of said data signals, and a source electrode;
    a plurality of second resistive elements each connected between a corresponding one of said drain electrode of said non-volatile memory elements and said second low potential level; and
    diode means connected between said source electrodes of said control transistors and said second low potential level.

2. A non-volatile memory circuit according to claim 1, in which said diode means comprise a plurality of diodes, each connected between a corresponding one of said source electrodes of said control transistors and said second low potential level.

3. A non-volatile memory circuit according to claim 1, in which said diode means comprise a single diode having one terminal connected in common to all of said source electrodes of said control transistors and the opposite terminal thereof connected to said second low potential level.

4. A non-volatile memory circuit according to claim 1, and further comprising a plurality of capacitors, each coupled between a corresponding one of said gate electrodes of said non-volatile memory elements and a common ground potential, each of said capacitors cooperating with a corresponding one of said first resistive elements to form an integrator circuit for eliminating the effects of transient voltage interference appearing on said common control terminal.

* * * * *